(12) United States Patent
Hack

(10) Patent No.: US 7,921,144 B2
(45) Date of Patent: Apr. 5, 2011

(54) FAST CORRECTLY-ROUNDING FLOATING-POINT CONVERSION

(75) Inventor: Michel Henri Theodore Hack, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 999 days.

(21) Appl. No.: 11/746,693

(22) Filed: May 10, 2007

(65) Prior Publication Data

US 2008/0281890 A1 Nov. 13, 2008

(51) Int. Cl.
*G06F 5/00* (2006.01)
(52) U.S. Cl. ........................................ 708/204
(58) Field of Classification Search ............... None
See application file for complete search history.

(56) References Cited

U.S. PATENT DOCUMENTS

| | | | | |
|---|---|---|---|---|
| 5,161,117 A | * | 11/1992 | Waggener, Jr. | 708/204 |
| 5,365,465 A | * | 11/1994 | Larson | 708/204 |
| 7,236,995 B2 | * | 6/2007 | Hinds | 708/204 |
| 7,685,213 B2 | * | 3/2010 | Reynolds | 708/204 |
| 2002/0184282 A1 | * | 12/2002 | Yuval et al. | 708/495 |
| 2007/0220076 A1 | * | 9/2007 | Hinds | 708/204 |
| 2008/0065709 A1 | * | 3/2008 | Hack | 708/204 |

OTHER PUBLICATIONS

Michel Hack, "On Intermediate Precision Required for Correctly-rounding Decimal-to-Binary Floating-Point Conversion", RNC6 (Real Numbers and Computers 6), Nov. 2004, Dagstuhl, Germany, pp. 113-134.
Abbot, et al., "Architecture and software support in IBM S/390 Parallel Enterprise Servers for IEEE Floating-Point arithmetic", IBM Journal of Research and Development, vol. 43, No. 5/6, pp. 723-760, Sep./Nov. 1999.
William D. Clinger, "How to Read Floating Point Numbers Accurately, Proceedings of the ACM SIGPLAN '90 Conference on Programming Language Design and Implementation", pp. 92-101, Jun. 20-22, 1990.
Steele, et al., "How to Print Floating Point Numbers Accurately", Proceedings of the ACM SIGPLAN '90 Conference on Programming Language Design and Implementation, pp. 112-126, Jun. 20-22, 1990.
Gordon Slishman, "Fast and Perfectly Rounding Decimal/Hexadecimal Conversions", IBM Research Report RC 15683, pp. 1-11, 1990.

* cited by examiner

*Primary Examiner* — David H Malzahn
(74) *Attorney, Agent, or Firm* — Tutunjian & Bitetto, P.C.; William J. Stock

(57) ABSTRACT

A system and method for converting bases of floating point numbers using fixed-point computation includes tables having different related spacings of exponent indices. The tables are adapted to cross-reference conversion ratios between exponent bases. The tables are characterized by bi-uniform spacings of source and target exponents and including near-unity table entries representing the conversion ratios. A source number is converted into a target number in a different radix by a sequence of reduction operations using a sequence of the tables. The reduction operations include reducing a source number exponent magnitude and accumulating a target exponent and multiplying a source number mantissa by a selected conversion ratio including a near-unity ratio of powers. A final mantissa is normalized and rounded to produce the target number in a new radix.

20 Claims, 4 Drawing Sheets

FAST CORRECTLY-ROUNDING FLOATING-POINT CONVERSION

BACKGROUND

1. Technical Field

The present invention relates to floating-point conversion and more particularly to a system and method for efficient and correct rounding for floating-point conversions.

2. Description of the Related Art

There are several ways to represent real numbers. For example on computers, fixed point places a radix point somewhere in the middle of the digits, and is equivalent to using integers that represent portions of some unit. For example, if four decimal digits are available, you could represent a number by 10.82, or 00.01. Another approach is to use rationals, and represent every number as the ratio of two integers.

Floating-point representation is the most common solution and basically represents real numbers in scientific notation. Scientific notation represents numbers as a base number and an exponent. For example, 123.456 could be represented as $1.23456 \times 10^2$. In hexadecimal, the number 123.abc might be represented as $1.23abc \times 16^2$.

Floating-point solves a number of representation problems, while fixed-point has a fixed window of representation, which limits it from representing very large or very small numbers. Also, fixed-point is prone to a loss of precision during multiplication or division.

Floating-point, on the other hand, employs a sort of "sliding window" of precision appropriate to the scale of the number. This easily permits the representation of both very large and very small numbers.

Correctly-rounding floating-point conversion from one radix to another needs an intermediate precision that is typically more than double the desired target precision, if a correctly-rounded result is needed. Until about ten years ago most programming environments only guaranteed a reasonably-bounded conversion error, e.g., one unit in the last place (one "ulp"), which can be achieved by a few simple multiplications in a target precision.

Correct rounding would be achieved by resorting to multiple-precision arithmetic, sometimes unconditionally, sometimes only for "difficult" numbers when an error analysis showed that the result was dangerously close to a rounding threshold. The cost of this extra mechanism would be several times that of a simple conversion, and would often require large amounts of scratch storage to hold extended-precision intermediate results.

SUMMARY

A system and method for converting bases of floating point numbers using fixed-point computation includes providing tables having different related spacings of exponent indices. The tables are adapted to cross-reference conversion ratios between numbers having different exponent bases. The source number is transformed into a target number in a different radix by a sequence of reduction operations, using a sequence of precomputed tables. Each step reduces the source exponent's magnitude and accumulates the target exponent, while multiplying the mantissa by a selected multiplier: e.g., a ratio of powers of two and ten that is very close to unity. The final mantissa is then normalized and rounded to produce the target number in a new radix. One new feature lies in the structure of the tables, which have the effect of minimizing variation in the mantissa's effective value, and permit a tightly bounded computational precision, needed for efficient fixed-point computation, without compromising correct rounding.

A system and method for converting bases of floating point numbers using fixed-point computation includes tables having different related spacings of exponent indices. The tables are adapted to cross-reference conversion ratios between exponent bases. The tables are characterized by bi-uniform spacings of source and target exponents and including near-unity table entries representing the conversion ratios. A source number is converted into a target number in a different radix by a sequence of reduction operations using a sequence of the tables. The reduction operations include reducing a source number exponent magnitude and accumulating a target exponent and multiplying a source number mantissa by a selected conversion ratio including a near-unity ratio of powers. A final mantissa is normalized and rounded to produce the target number in a new radix.

A system/method for converting bases of floating point numbers using fixed-point computation methods, includes constructing an indexing exponent by adding a bias to a residual exponent to cause a next residual exponent to match a range covered by a next conversion table, dividing the indexing exponent by a table spacing, producing an unsigned quotient q, and deriving an unbiased index k from the quotient q. If the unbiased index is zero, skip a current table and go to a next table. If the unbiased index is non-zero, extract a conversion multiplier from the current table using the unsigned quotient as an index into the current table. A fixed-point intermediate product is multiplied by the conversion multiplier and a product of the unbiased index and a spacing of a target exponent (k*target_spacing) is added to an accumulating target exponent. A product of the unbiased index and a spacing of a source exponent (k*source_spacing) is subtracted from the residual exponent. If the residual exponent is non-zero, proceed to the next table, otherwise exponent reduction is complete.

A system for converting bases of floating point numbers using fixed-point computation includes a plurality of tables configured with different related spacings of exponent indices, the tables being adapted to cross-reference conversion ratios between exponent bases, the tables being characterized by bi-uniform spacings of source and target exponents and including near-unity table entries representing the conversion ratios. A processor is configured to convert a source number into a target number in a different radix by a sequence of reduction operations using a sequence of the tables by reducing a source number exponent magnitude and accumulating a target exponent and multiplying a source number mantissa by a selected conversion ratio including a near-unity ratio of powers. A fixed-point accumulator is configured to store intermediate products converted with the near-unity ratios such that bounded fixed-point operations fit to provide a desired precision. Intermediate precision computations are based upon continued fraction theory.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
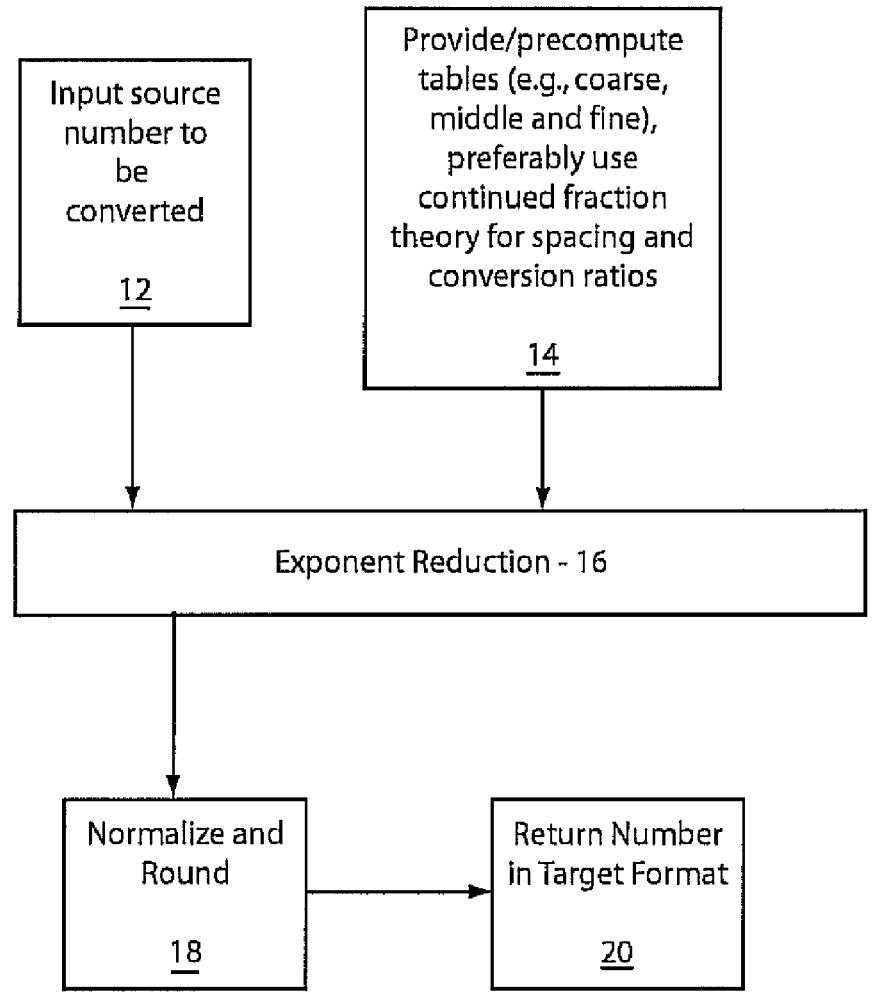
FIG. 1 is a block/flow diagram showing a system/method for converting between floating-point radixes in accordance with the present principles.

An improved system and method for fast floating-point conversion is presented. In particularly useful embodiments, conversion from binary-to-decimal and decimal-to-binary are contemplated. In accordance with one embodiment, needed intermediate precision can be precomputed and selected as a function of the desired result precision. Less intermediate scratch storage is needed in accordance with the present principles than for conventional methods, and a final rounding step provided herein is more efficient.

The embodiments described here are relevant to computational devices, computers, e-server platforms, and any other device or system which performs base conversion. In one implementation, the present principles may be applied to conversion instructions, and library routines for programming systems.

The present principles employ precomputed tight bounds on needed intermediate precision, and select multipliers using a Continued Fraction expansion of, e.g., $\log_{10}(2)$ for tight control of the value range that is subject to a final rounding step.

Embodiments of the present invention can take the form of an entirely hardware embodiment, an entirely software embodiment or an embodiment including both hardware and software elements. In a preferred embodiment, the present invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution.

Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The methods and systems may be implemented on or as part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Floating-point computations are generally not exact, meaning that the mathematical value of the result is not exactly equal to the infinitely precise result based on the mathematical value of the inputs. Each input does have a precise mathematical value: it is the product of an integer times a positive or negative power of the base, and hence a rational number. The product of two three-digit numbers can however have up to six digits, so if the floating-point format is limited to three digits, the exact result will have to be rounded to three digits. This single rounding can however be described precisely: the result is one of the two three-digit rounded numbers that bracket the exact result. To give a simple example, 1.23 times 2.34 is 2.8782 exactly, and the two bounding three-digit numbers are 2.87 and 2.88. The rounding rule will pick one (e.g. 2.88 for round-to-nearest). The rule also specifies what to do in case of a tie, e.g. 1.25*2.34 is 2.9250 which is exactly between the two bounding three-digit numbers 2.92 and 2.93. The IEEE "half-even" rule would pick the even one, 2.92; school rounding ("half-up") would pick the larger one, 2.93. This describes a single operation, in this case multiplication.

A complex operation like base conversion usually involves multiple steps, but it too can be defined to produce an "infinitely precise" mathematical result, which is then rounded to a correctly-rounded result in the same way as described for a single operation. One key point is the single rounding step. In practice, we do not compute with "infinite" precision, so we produce an intermediary result that has higher precision than the desired final result (e.g. multiplication produces an intermediate result that has up to twice the precision of the final result). In a multiple-step operation, the maximum possible intermediate rounding error can be tracked (when not using infinite precision). If the last intermediate result is sufficiently far from a rounding threshold (e.g., the midpoint between two final-precision numbers, for round-to-nearest) so that the worst intermediate rounding error could not cross the rounding threshold, then rounding correctly is easy. For example, compute an intermediary result of 2.877, and the maximum error is 0.001, then the true value is anywhere between 2.876 and 2.878—but both would round up to 2.88, because 2.877 was sufficiently far from the rounding threshold of 2.8750 (the final precision is three digits in the example).

In base conversions, to go from $B*2**b$ to $D*10d$ B is multiplied by $r=2b/10**d$. The decimal exponent d can be found from the binary exponent b by observing that B and D each have a narrow range, frequently overlapping in value, so that d is roughly 3.3 times b (taking logarithms). Various techniques known in the art determine this multiplier r, and usually a floating-point or other approximation of r is employed instead of the exact rational value, and also more than one multiplication may be used (to cut down on the number of precomputed multipliers that may be stored in some table), so this operation is carried out with some intermediate precision that is higher than the desired final precision.

Correctly-rounding floating-point conversion from one radix to another needs an intermediate precision that can be tightly bounded by the sum of a source precision and a target precision (both expressed in bits, hereinafter), plus a constant that is derived via Continued Fraction theory from the target precision and the exponent range to be covered. Continued Fraction theory can also be used to choose multipliers very close to unity (1.0), which permits a particularly effective final rounding step for decimal results and reduces slop needed for residual shift of binary results. Slop is used in computer arts to denote an allowance for growth, which may be unpredictable but is bounded.

Some sample numbers of bits needed for conversion between the Binary and Decimal formats defined in IEEE 754R (draft, IEEE Sponsor Ballot December 2006) are as follows:

Binary32→Decimal32 24+26+4=54

Binary64→Decimal64 53+55+7=115

Binary128→Decimal128 113+115+12=240

In the first example, in converting a 32 bit binary number to a 32 bit decimal number, the source precision (binary 32) is 24 and the target precision (decimal 32) is 26. In addition, 4 extra bits are needed in accordance with Continued Fraction Theory and the exponent range needed to be covered.

A few extra bits are needed to cover computational round-off errors, and the practical sizes may be a multiple of some machine unit size, for example 64 bits for multiple-precision integer arithmetic, or 52 bits for an implementation exploiting new unnormalized Hexadecimal Multiply-and-Add instructions.

An example computation of a conversion from one radix (B) to another (D) will now be described. An infinite-precision conversion of a binary (B) floating-point number to a decimal (D) floating point number would proceed as follows:

Input: $B*2**2$ where B is a p-bit number (e.g., p=53)
Output: $D*10**d$ where D is a q-digit number (e.g., q=16)
with:
$(D+F)*10**d=B*2^b$ where $-\frac{1}{2} \leq F \leq +\frac{1}{2}$.

Here F is a fraction, and is the difference between the returned significand D (an integer) and the infinitely precise result. If F=0 (exactly), the conversion is exact; if $|F|=\frac{1}{2}$, there is a tie to be broken, and the rounding rule decides which way to round an exact half-way result.

In practice, computation is carried out with limited precision, however, possibly in both the multiplications involved, and in the chosen internal representation of the multipliers (in this case, binary representations of selected powers of ten). The result is a fixed-point number U+V where U is the integer part, and $|V| \leq \frac{1}{2}$ is the fraction part, such that: U+V+e=D+F (where e is the computation error).

It can be shown that there is a bound L such that $|e|<L$ guarantees that the sign of F will be the same as the sign of V, and that exact and half-exact cases can be identified reliably: if $|V|<L/2$ then F=0, and if $(\frac{1}{2}-|V|)<L/2$ then $|F|=\frac{1}{2}$. This bound is where Continued Fraction theory is involved.

Briefly, a Continued Fraction (CF) development of a number includes separating an integer part from a fraction part, and then taking the inverse of a non-zero fraction part, which will be a new number that exceeds one, and hence has a non-zero integer part and a new fraction. This process is repeated until the fraction part is zero, or until enough "partial quotients" have been computed. The partial quotients are the successive integers extracted in the process described above. So the original number x is equal to $a_0+1/(a_1+1/(a_2+ \ldots )))$ where the $a_i$'s are the successive partial quotients. If we evaluate that expression up to the nth partial quotient, we get the nth Continued Fraction approximation, called the nth Partial Convergent. These are rational numbers P/Q that get closer and closer to x.

Partial Convergents are the best rational approximations of the original value x in the sense that any rational approximation with a smaller denominator will necessarily be worse. A mediant between two rational numbers P/Q and R/S is a rational number of the form (P+kR)/(Q+kS) for some positive integer k, and it can be seen that these are all between P/Q and R/S in value. If P/Q and R/S are two successive Partial Convergents of the CF expansion of x, then they bracket x (one is bigger, the other is smaller), and among the mediants is in fact the next Partial Convergent, for $k=a_{(n+1)}$. The other mediants are also good approximations, better than the previous Partial Convergent but not as good as the next one, and so they provide another source of "near difficult" numbers. Rational approximations that are neither Partial Convergents nor mediants are so far off that they constitute "easy" numbers whose conversion requires no more precision than the absolute minimum, the sum of the source and target precisions plus the computational error of one or two bits.

In accordance with the present principles, a system/method for correctly-rounding floating-point conversion from one radix to another using fixed-point computation is described. A table or tables of precomputed r multipliers are compiled. The tables are indexed using exponents of a first base against a second base. In the example, the first based may be binary and the second base may be decimal. The table(s) include the r multipliers (where $r=10d/2b$ or $2b/10d$) according to the index b,d or d,b.

When reducing the initial binary (or decimal) exponent, while computing a corresponding decimal (or binary) exponent: We compute (D+F) by multiplying the given B (in Binary-to-Decimal conversion) by the multiplier r, which can be retrieved from the precompiled table according to (b, d) where 2b/10d.

Rather than having one huge table of precomputed multipliers (e.g., a table with 10,000 or more entries) of the form above for the possible range of b (−16493 to +16384 in the case of Binary128 input), the factor is broken up into several subfactors, from coarse to fine, each time reducing the remaining exponent range. This may include several smaller tables. In one example, a coarse table, a middle table and a fine table are employed.

In traditional conversion methods, coarse multipliers (ratios of powers of two and ten) may be selected whose binary exponents are multiples of, e.g., 1024, leading to a residual binary exponent range of 1024 (down from 32878). A finer set of multipliers (middle table) could then be broken down at a next level using, e.g., 32 levels. For example, breaking the 1024 exponent range down by exponent multiples of 32, leading to a final table of 32 lines of multipliers. This may be done again (e.g., a fine table) to permit a plurality of multiplications, e.g., 2 or more factors. Those multipliers r (pairing the powers of two with the nearest power of ten) would however have values spanning a range of up to 20. The initial value B spans a range of 2, so the value after three multiplications of this kind could span a range of 2*20*20*20, or four decimal orders of magnitude: the accumulated decimal exponent d corresponding to this binary exponent reduction could be off by as much as 4 from the desired value, thus requiring an additional correction step. While a correction step is an additional operation, this step more than offsets the ease of indexing obtained by breaking the 15-bit exponent into three 5-bit indexes.

Breaking up the exponent to be reduced into a coarse part and a fine part, or sometimes into a coarse, middle and fine part, is like breaking up a three-digit number into a sum of hundreds, tens and units. This is because multipliers here are powers, and a product of powers corresponds to a sum of exponent parts. For example, instead of having one table with a thousand entries we could have three tables with ten entries each, for a significant reduction in space. Two or more tables may be provided. The exponent to be reduced (input) is broken up into binary parts, e.g., coarse*1024+middle*32+fine (this is opposed to coarse*100+middle*10+fine). The entries may be spaced regularly in terms of the indexing exponent, which is either decimal or binary. For example, on one side of the table decimal exponents may be spaced regularly at 1024 intervals for the coarse table, 32 intervals for the middle table, etc. If all entries (r) are to be close to unity in value (as a ratio of powers of ten and two), the other exponent (relative to the indexing exponent) tends not to be spaced regularly; alternatively, entries at the ends of the table are likely to stray far from one (by more than a factor of two). If the starting exponent is the indexing exponent, broken up into indexing parts, the lookup of entries is easy. If conversion is in the other direction, it is generally cheaper to convert the given exponent into an indexing exponent of the other base, e.g. by multiplying a decimal exponent by log(2)=0.30103 to get the binary indexing exponent.

In contrast with the traditional approach, the multipliers r herein are selected which are very close to unity, so that the initial range of 2 does not blow up to much more than a range of 20 (it should be at least 20 in order to accommodate the possible range of D/B).

Now, in the final correction computation r=2x/10y, which is particularly close to 1 when x/y is a Partial Convergent of the Continued Fraction (CF) expansion of the decimal logarithm of 2, $\log_{10}(2)$, which is approximately 0.30102999566398 . . . and has CF expansion [0; 3, 3, 9, 2, 2, 4, 6, 2, 1, 1, . . . ] and whose first few partial convergents are: 0/1, 1/3, 3/10, 28/93, 59/196, 146/485, 643/2136, 4004/13301, etc.

Ratios of the corresponding powers of ten and two are very close to one, e.g., 1028/293=1.00974 and 10643/22136=0.99984. These multipliers are two that can be used, for the second (e.g., middle) and first (e.g., coarse) multiplier tables. The second table can cover the spacing between entries of the first table, for example, if the first table includes exponents in 643 sized intervals a nice fit of 28 sized intervals can be provided in the second table (since 23*28=644), and that range also happens to correspond to the BFP64 and DFP64 exponent ranges, which consequently can usually skip the first multiplication as will be described in greater detail below.

Another nice fit that may be exploited here is that the spacing of the second table—28 powers of ten—corresponds to the largest power of five that can be held in a 64-bit integer, namely 5**27. This permits the third (e.g., fine) or last multiplier to be an exact ratio of a power of ten and a power of two. (The other ratios are truncated to a precision of 256 bits).

The present method takes advantage of a tight precision bound, and uses fixed-point arithmetic because the precision is beyond the range that extended-precision floating-point can handle well. Since precision is not wasted, the present methods are fast, and have the advantage that conversion speed is not erratic as it is with conventional two-way methods. In some contexts, in particular, for machine instructions, as will be implemented System z mainframes, this predictable performance is advantageous.

The tight precision does not give much leeway for delayed normalization, which is one reason that it would be advantageous to have the multipliers be close to unity. The combination of fast fixed-point arithmetic and the requirement for correct rounding of extreme exponents, at a predictable performance that matches that of less-constrained implementations advances the state of the art.

In accordance with present principles, the present method also provides an improvement in the last step of binary to decimal conversion, where the intermediate result may have N+1 digits when N digits were required. In previous algorithms, the entire conversion is repeated with a multiplier that is ten times smaller (the index into the table is adjusted by 1), so the expected final exponent is precomputed with extra care (a logarithm computation) in order to reduce the probability of a retry.

Advantageously, the present methods employ two separate rounding paths (of roughly equal length, but different methods) to handle N+1 and N-digit cases directly.

Economic impact is provided in employing the present principles which derives from the fact that all manufacturers have to do something about their conversion algorithms if they are to comply with the upcoming IEEE standards.

Referring now to the drawings in which like numerals represent the same or similar elements and initially to FIG. 1, a block/flow diagram depicts a system/method 10 for correctly-rounding floating-point conversion from one radix to another using fixed-point computation. In block 12, an input source number is provided for conversion. In block 14, tables are precomputed with uniform spacings for both radixes. (See e.g., FIG. 3). This may be achieved using Continued Fraction Theory.

Continued Fraction theory enters the design of the algorithm in two ways: (a) in determining the intermediate precision needed for correct rounding, and (b) in the construction of the multiplier tables, to ensure the two desirable properties of near-unity values and of equal exponent spacing for source radix and target radix. It is not used during the actual conversion process, as the tables are pre-computed, and the precomputed precision is selected based on the formats being converted. Table entries have the precision that corresponds to the most demanding supported format conversion, e.g., between binary128 and decimal128 (in which case 240 bits are needed, and in practice 256 bits would be used since that is an integral number of 32-bit or 64-bit machine words).

In block 16, exponent reduction is performed. This will be explained in greater detail with reference to FIG. 2. In block 18, a normalization and rounding process is performed as will be described with reference to FIG. 2. In block 20, a number is returned in target format.

Figure 2:
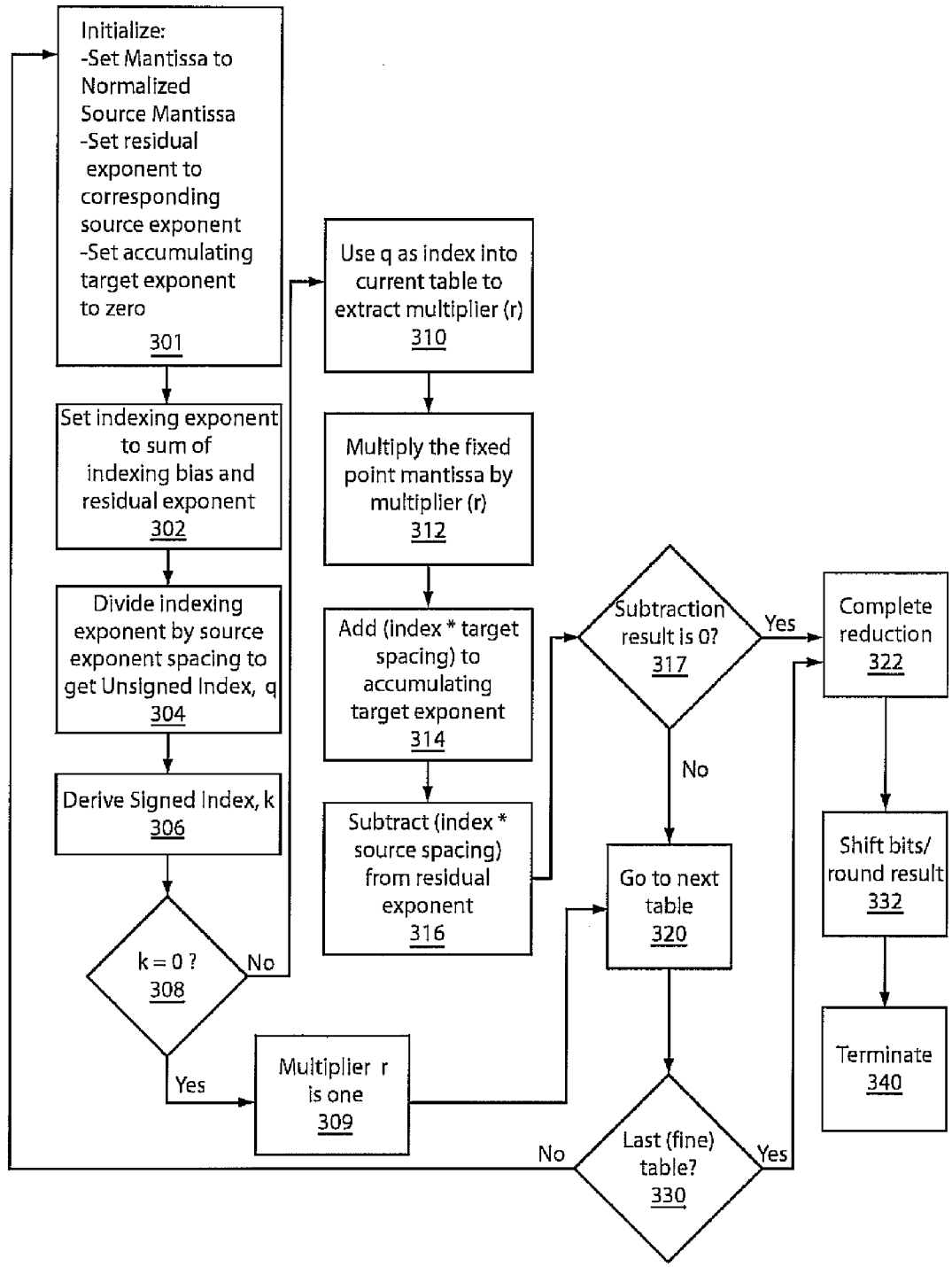
FIG. 2 is a block/flow diagram showing a system/method for converting between floating-point radixes in accordance with a more detailed embodiment.

Referring now to FIG. 2 with continued reference to FIG. 1, a system/method for exponent reduction (block 16), normalization and rounding (block 18) is illustratively depicted. As an illustration, conversion from decimal floating-point to binary will be described, which involves multiplying an input by a ratio of powers of ten and two, so as to "reduce" the original decimal exponent and "accumulate" a corresponding binary exponent. The present principles are applicable to any conversions between exponent bases. The following description should be read to include any conversion and not be limited by the illustrative example given. Note the following terminology: "mantissa" is the traditional term used for the significant bits of a floating-point number, regardless of interpretation, and "coefficient" is used when the mantissa is interpreted as an integer.

Begin with: input=coefficient*10**exponent. The goal is to end with: output bincoeff*2**binexp, where bincoeff is the binary coefficient and binexp is the binary exponent. These two numbers represent the same value, subject to a rounding offset, since bincoeff will be rounded to an integer: bincoeff=round(coefficient*10exponent/2binexp)). Therefore, in block 301, the parameters are initialized: set the mantissa to a normalized source mantissa; set residual exponent to a corresponding source exponent; and set accumulating target exponent to zero.

If this is a same-precision conversion (e.g. decimal128 to binary128), the coefficients (coefficient and bincoeff) will be roughly the same size, and binexp will be chosen to be close to exponent*(log(10)/log(2)).

Conversely, when going from binary to decimal, start with input=coefficient*2**exponent and end up with output=deccoeff*10**decexp, where deccoeff is the decimal coefficient and decexp is the decimal exponent. In this case: deccoeff=round(coefficient*2exponent/10decexp)).

These exponents may be negative, which is the same as flipping the ratio upside down, so that both directions involve the same type of multipliers, namely ratios of powers of two and ten. Traditional methods compute this other-radix exponent (binexp or decexp) and pick the conversion ratio out of a table. Since for a large exponent range that table could include thousands of entries, in accordance with one embodiment, several tables are employed. In block 14 of FIG. 1, these tables are sized and computed. The pre-computation of tables may be a one-time computation. Once the tables are provided then the tables may be employed for many conversions.

Figure 3:
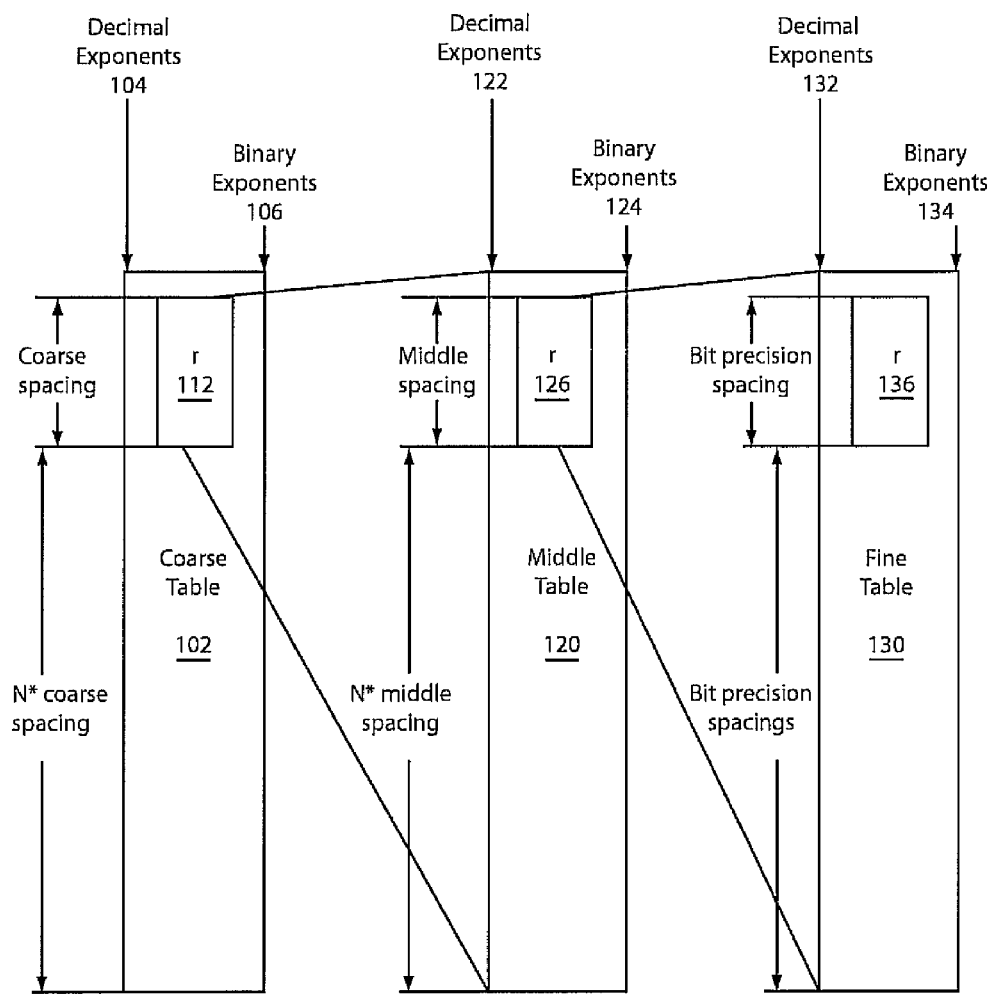
FIG. 3 is a diagram showing conversion ratio look up tables in accordance with one illustrative embodiment.

The tables advantageously use a spacing of exponents derived from Continued Fraction theory. The entries can then denote ratios where the exponents are equally spaced in both binary and decimal, which makes indexing easy in either direction (binary to decimal or decimal to binary), a property not shared by conventional tables. For example, the exponent decimal spacings/binary spacings chosen are 643/2136 for the coarse table, and 28/93 for the middle table. The fine table would then resolve a residual decimal exponent of 0 to 27, or a residual binary exponent of 0 to 92. In this range, the ratios can be represented exactly with 64-bit precision (because 527<264), which is a further advantage of the present principles. FIG. 3 shows an illustrative table set.

Referring to FIG. 3, three tables are shown. Coarse table 102 includes decimal indices 104 and equivalent binary indices 108. Since Continued Fraction Theory may be employed, spacing indices 104 and 108 are spaced such that ratio multiplies r 112 in the table are approximately unity. A middle table 120 includes different indices 122 and 124 that provide regular periodicity and provide ratios or multipliers r 126 that are disposed between the indices 104 and 108 of the coarse table. A fine table 130 includes residual decimal and binary exponents 132 and 134, respectively. Fine table 130 includes bit precision integer multiples r 136 to be able to complete the computation on any residual remainder.

In block 16 of FIG. 1, an exponent reduction is performed. This is depicted in greater detail in FIG. 2. Note that the range of decimal exponents to be covered by the widest format in use is about −6200 to +6200 (for Decimal128), and the range of binary exponents is about −16500 to +16500 (for Binary128). The format determines the range that needs to be covered by the tables. When converting narrower precisions, with less exponent range, e.g., the common "double" (binary64), the coarse table is typically not needed; here the most complicated conversion is described to illustrate the full method.

The coarse table has entries of the form 2**(k*2136)/10**(k*643) for k ranging from −10 to +10. This covers a decimal exponent range of −6430 to +6430, large enough to cover the widest supported format. If k=0 the multiplier would be 1, and that table can be skipped. This is how the general method deals with narrow formats.

Exponent reduction is started in block 301 by initializing an accumulator to the normalized source mantissa, setting a residual exponent to the corresponding source exponent, and clearing an accumulating target exponent. In block 302, a bias is added to the residual exponent to derive or construct a positive indexing exponent. This bias is chosen so as to adjust the residual exponent range at the end of this reduction step to match the range of a next table. In block 304, the indexing exponent is divided by the source exponent spacing of the table to get an unsigned index q.

In block 306, a signed index k is derived by subtracting from q an unsigned index of an entry for index exponent zero (which corresponds to a multiplier of one). In block 308, a determination is made for k=0. If k=0 the multiplier would be 1, and that table can be skipped in block 309. Otherwise, in block 310, the unsigned index q is used to select a multiplier (r) from the table. This is a ratio of powers of two and ten whose value is very close to one: r=2**(k*bs)/10**(k*ds) where bs is the binary exponent spacing and ds is the decimal exponent spacing of the table.

In block 312, the current mantissa in the accumulator is multiplied by the selected multiplier (r) using fixed-point multiplication with the predetermined tightly-bounded precision.

It is the source-radix exponent (input) that is being reduced. We also need to accumulate a corresponding target-radix exponent (output). This is most easily accomplished by subtracting k*source_spacing from the residual exponent and adding k*target_spacing to the accumulating exponent in block 314 and 316, respectively. The bias also permits shifting the residual range, and we pick a bias so that the residual range will be −1112 to 1023 if binary (a span of 2136), or −308 to 334 if decimal (a span of 643). The range has a fixed span determined by the table spacing, but can be shifted towards more positive or more negative values by adjusting the indexing bias. Here, a balanced range is chosen, so that it covers the exponent range of the binary64 and decimal64 formats, and the first table can be avoided completely for those common formats.

The middle table has entries of the form $2^{**}(k*93)/10^{**}(k*28)$ for k ranging from −11 to +11. This covers a decimal exponent range of −1115 to +1023, covering the residual range of the coarse table, as well as the range of binary64 (ordinary "double" in the C language). Its indexing bias is chosen so as to leave a non-positive residual exponent of −27 to 0 if decimal, or −92 to 0 if binary. The reason for this is that the fine table can now hold entries of the form $2^{}x/10^{}y$ where y ranges from −27 to 0—or $5^{}(-y)/2^{}(y-x)$, which (aside from the binary scale factor) are exactly representable as 64-bit integers. Advantageously, this eliminates a rounding error, and significantly improves the speed of the last multiplication. In this case the index is always derived directly from the residual decimal exponent, and only indirectly from a binary residual exponent, but the tradeoff is worth it.

As described for block 301, the initial residual exponent is the source exponent (decimal or binary), and the initial accumulated target exponent is zero. The initial mantissa is the input coefficient, properly aligned in a fixed-point multiple-word working "accumulator". There is a small number of leading zero bits to accommodate value growth (when the multiplier exceeds one), and sufficiently many trailing zeros to accommodate the required intermediate precision. The non-zero part of the fraction will grow, and at some point low-order bits will be discarded as this is a bounded-precision multiplication. The theory upon which the needed intermediate precision is based guarantees that this rounding error will not affect the final correctly-rounded result.

The biases and divisors used depend on the table and the conversion direction. Each table has a binary exponent spacing and a decimal exponent spacing; both regular. The divisor is the source-exponent spacing.

Turning again to block 314, k*target_spacing is added to the accumulating target exponent. In going from decimal to binary the target is binary, the index k is the same for decimal and binary and the target_spacing is 2136 for the coarse table in this example. The accumulating exponent is the partially computed target exponent. In block 316, k*source_spacing is subtracted from the residual exponent. In going from decimal to binary the source is decimal, the index k is the same for decimal and binary and the source_spacing is 643 for the coarse table in this example. In block 317, check if the subtraction results in zero. If the residual exponent is non-zero, proceed to the next table in block 320. Otherwise, exponent reduction is complete in block 322.

In block 330, it is determined if the last (e.g., fine) table has been encountered. Then, the reduction is complete in block 322. The multiplication using the "fine" table may be followed by a number shift, in block 332 of up to four bits to reduce a residual binary exponent completely (due to the implicit spacing of binary exponents in that last table, where the decimal exponents are spaced by 1). This shift is combined with the normalization shift that will be described next.

At this point, an accumulator holds an integer before the implied binary point. This integer is almost in the proper range for a coefficient in the target format. If that is binary, counting leading zeros will determine the necessary compensating shift of block 332, and adjust the accumulated binary exponent accordingly. If it is decimal, the integer (expressed in decimal) would have either the desired number of digits, or one more. This can be guaranteed by choosing the number of bits for the integer part appropriately, and taking advantage of the limited value range of the multipliers. The "fine" table multipliers necessarily have a range of about 10 in size, and (due to pre-normalization in the accumulator) the initial mantissa has a size range of 2. As long as the total size range of the final mantissa in the accumulator is less than 50, the range can be chosen so as to cross only one power-of-ten boundary, and this is why we end up with either N or N+1 digits. Given the possible initial range and the range of the "fine" multiplier, this leaves a factor of 2.5 for the product of all other multipliers. This is where the choice of tables is important. Having derived the tables from Continued Fraction theory, the range of multipliers is very tight, namely 0.999 to 1.001 for the "coarse" table and 0.898 to 1.113 for the "middle" table. The total range for the final mantissa is then less than 35, comfortably less than 50. Traditional table entries have values that span a factor of two or more each, making it more difficult to achieve the N versus N+1 effect.

Tight multipliers are also needed when converting to binary: leading zero bits are needed in the accumulator, and we should not lose so many bits that we end up with fewer bits than are needed for a full coefficient. With the present method the final adjustment is at most 6 bits, which is preferable.

The method depends on recognizing exact products, and yet computes with bounded precision, so one further step is preferred. In block 332, a final rounding or truncation is performed. If the offset of the computed mantissa from an exact product (which would have as many trailing zeros as the excess of the intermediate precision over the target precision, minus 1) is less than a reasonably tight bound on the computational error, the mantissa is rounded to the nearest exact form (which has all those trailing zeros). The system/method terminates in block 340.

This error-eliminating rounding is most easily performed by using truncating multiplication (with truncated as opposed to rounded multipliers), so that the computation error is always in the same direction: the computed product never exceeds the true product. In that case, false-inexact results have a large number of consecutive one-bits in the fraction. If the product is not already exact (many trailing zeros including the last few bits), force the last few bits (as many as are computationally uncertain) to ones, then add one in the last place. If this was a false-inexact, carry propagation will correctly round to the corresponding exact result; if it was not, carry propagation will stop long before reaching the final rounding position, and the properties required for correct rounding will not be disturbed.

Having determined the final target coefficient, with a fractional part that is zero if and only if truly zero, ½ if and only truly ½, and above or below ½ if and only truly so ("truly" refers to the fraction that would have been computed if exact arithmetic had been used, as opposed to the truncated arithmetic actually used), the applicable rounding rules can be used to round the coefficient correctly to the final result to be delivered.

The method can be extended to cover even larger exponent ranges, by adding a new higher-order table. At present, current embodiments (e.g., for currently implemented instructions) only need to cover IEEE 754(2007) formats, but the method is general and can be extended beyond this standard.

Figure 4:
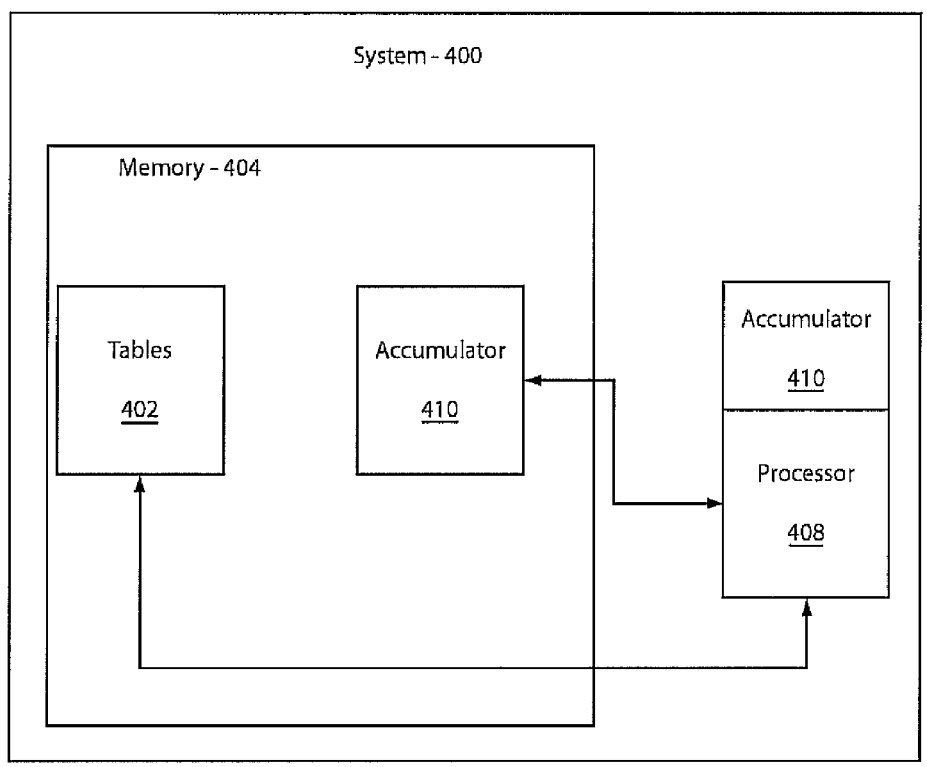
FIG. 4 is a block/flow diagram showing a system for converting between exponents based in accordance with the present principles.

Referring to FIG. 4, a system 400 for converting bases of floating point numbers using fixed-point computation is illustratively depicted in accordance with one embodiment. A plurality of tables 402 is configured to have different related spacings of exponent indices (see, e.g., FIG. 3). The tables 402 preferably include bi-uniform spacings of source and target exponents and include near-unity table entries representing the conversion ratios. The tables 402 are stored in memory 404 and are preferable precomputed. The tables 402 are adapted to cross-reference conversion ratios between numbers having different exponent bases. The spacings are preferably based upon continued fraction theory and are uniform spacings for both a source base and for a target base. The conversion ratios are substantially close to unity (e.g., within about 15% of unity).

A processor 408 is configured to carry out the process of FIGS. 1 and 2. The processor 408 converts a source number into a target number in a different radix by a sequence of reduction operations using a sequence of the tables and by reducing a source number exponent magnitude and accumulating a target exponent and multiplying a source number mantissa by a selected conversion ratio including the near-unity ratio of powers.

An accumulator 410 may be implemented in memory or in the processor 408. The accumulator 410 preferably includes a fixed-point accumulator configured to store intermediate products converted with the near-unity ratios such that bounded fixed-point operations fit to provide a tightly-bounded precision. One advantage is that the fixed-point accumulator 410 used here can often be instantiated in processor registers, avoiding the need for an accumulator in memory (as used in traditional multiple-precision methods with loose precision bounds). Accumulator 410 is configured to sum the partial quantities as described hereinabove. The accumulator 410 exploits the bi-uniform spacing of source and target exponents used in tables 402 to efficiently convert exponents in both conversion directions. Advantageously, near-unity values of table entries (402) help to bound the variability of intermediate products so as to fit in a tightly-bounded fixed-point accumulator 410. In addition, this tight range of the final product is employed to simplify the final rounding step. These optimizations reduce the intermediate storage space needed for conversions and provide a more efficient computation time.

Having described preferred embodiments of a system and method for fast correctly-rounding floating-point conversion (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for converting bases of floating point numbers using fixed-point computation, comprising:
providing tables stored in a computer readable storage medium having different related spacings of exponent indices, the tables being adapted to cross-reference conversion ratios between exponent bases, the tables being characterized by bi-uniform spacings of source and target exponents and including near-unity table entries representing the conversion ratios;
converting a source number into a target number in a different radix by a sequence of reduction operations using a sequence of the tables, including:
reducing a source number exponent magnitude and accumulating a target exponent; and
multiplying a source number mantissa by a selected conversion ratio including a near-unity ratio of powers; and
normalizing and rounding a final mantissa to produce the target number in a new radix.

2. The method as recited in claim 1, wherein providing includes providing spacings based upon continued fraction theory.

3. The method as recited in claim 1, wherein converting includes employing an intermediate precision based upon continued fraction theory.

4. The method as recited in claim 1, wherein providing includes providing a coarse table, a middle table and a fine table.

5. The method as recited in claim 1, wherein computations are performed as fixed point computations.

6. The method as recited in claim 1, further comprising biasing an exponent range on each table to provide selected exponent ranges.

7. A computer program product for converting bases of floating point numbers using fixed-point computation, comprising a computer readable storage medium including a computer readable program, wherein the computer readable program when executed on a computer causes the computer to perform the steps as recited in claim 1.

8. A method for converting bases of floating point numbers using fixed-point computation methods, comprising:
constructing an indexing exponent by adding a bias to a residual exponent to cause a next residual exponent to match a range covered by a next conversion table stored in a computer readable storage medium;
dividing the indexing exponent by a table spacing, producing an unsigned quotient q;
deriving an unbiased index k from the quotient q;
if the unbiased index is zero, skipping a current table and go to a next table;
if the unbiased index is non-zero, extracting a conversion multiplier from the current table using the unsigned quotient as an index into the current table;
multiplying a fixed-point intermediate product by the conversion multiplier;
adding a product of the unbiased index and a spacing of a target exponent (k*target_spacing) to an accumulating target exponent;
subtracting a product of the unbiased index and a spacing of a source exponent (k*source_spacing) from the residual exponent; and
if the residual exponent is non-zero, proceeding to the next table, otherwise exponent reduction is complete.

9. The method as recited in claim 8, wherein the table spacings are determined based upon continued fraction theory.

10. The method as recited in claim 9, wherein the table spacings are uniform for a source base and are uniform for a target base.

11. The method as recited in claim 9, wherein the conversion multipliers are substantially close to unity.

12. The method as recited in claim 8, wherein intermediate precision computations are based upon continued fraction theory.

13. The method as recited in claim 8, wherein the current table includes one of a coarse table, a middle table and a fine table.

14. The method as recited in claim 13, wherein the next table includes one of a middle table and a fine table.

15. The method as recited in claim 8, wherein computations are performed as fixed point computations.

16. A computer program product for converting bases of floating point numbers using fixed-point computation, comprising a computer readable storage medium including a computer readable program, wherein the computer readable program when executed on a computer causes the computer to perform the steps as recited in claim 8.

17. A system for converting bases of floating point numbers using fixed-point computation, comprising:
- a plurality of tables configured with different related spacings of exponent indices, the tables being adapted to cross-reference conversion ratios between exponent bases, the tables being characterized by bi-uniform spacings of source and target exponents and including near-unity table entries representing the conversion ratios;
- a processor configured to convert a source number into a target number in a different radix by a sequence of reduction operations using a sequence of the tables by reducing a source number exponent magnitude and accumulating a target exponent and multiplying a source number mantissa by a selected conversion ratio including a near-unity ratio of powers; and
- a fixed-point accumulator coupled to the processor and configured to store intermediate products converted with the near-unity ratios by the processor during the source number mantissa by the selected conversion ratio such that bounded fixed-point operations fit to provide a desired precision.

18. The system as recited in claim 17, wherein the spacings are based upon continued fraction theory.

19. The system as recited in claim 17, wherein an intermediate precision is based upon continued fraction theory.

20. The system as recited in claim 17, wherein the plurality of tables include a coarse table, a middle table and a fine table.

* * * * *